United States Patent [19]

Possati

[11] 4,456,130

[45] Jun. 26, 1984

[54] SYSTEM FOR THE SUSPENSION OF MODULAR UNITS

[75] Inventor: Mario Possati, Bologna, Italy

[73] Assignee: Finike Italiana Marposs S.p.A., S. Marino di Bentivoglio, Italy

[21] Appl. No.: 370,391

[22] Filed: Apr. 21, 1982

[30] Foreign Application Priority Data

Jul. 17, 1981 [IT] Italy ................................ 3482 A/81

[51] Int. Cl.³ ............................................... A47F 7/00
[52] U.S. Cl. ...................................... 211/26; 248/146; 361/331; 361/427
[58] Field of Search ................... 211/45, 47, 182, 126, 211/46, 26; 324/156, 157; 248/146, 150, 159, 215, 231.8; 361/331, 427

[56] References Cited

U.S. PATENT DOCUMENTS

| | | | |
|---|---|---|---|
| 2,243,370 | 5/1941 | Bell | 211/182 |
| 2,349,385 | 5/1944 | Snelling | 211/126 |
| 2,581,032 | 1/1952 | Landsman | 211/182 X |
| 3,252,614 | 5/1966 | Evans | 211/126 X |
| 3,586,276 | 6/1971 | O'Mahoney | 248/215 X |
| 4,049,125 | 9/1977 | Rochestie | 211/47 |

FOREIGN PATENT DOCUMENTS

| | | | |
|---|---|---|---|
| 759829 | 5/1967 | Canada | 211/126 |
| 349186 | 5/1931 | United Kingdom | 211/126 |

Primary Examiner—Ramon S. Britts
Assistant Examiner—Blair M. Johnson
Attorney, Agent, or Firm—Stevens, Davis, Miller & Mosher

[57] ABSTRACT

A suspension system for an electric gauge of the modular type includes one or more, substantially vertical, modules and a supporting device for supporting the modules comprising a base plate, a stanchion fixed to the base plate, and horizontal cylindrical rods threadedly coupled with the stanchion. The casings of the modules have resilient hooks which are coupled by interference fit with the cylindrical rods for hooking the modules to the supporting device.

18 Claims, 6 Drawing Figures

SYSTEM FOR THE SUSPENSION OF MODULAR UNITS

The present invention relates to a suspension system for an electrical gauge of the modular type with one or more modules, a support device for sustaining the module—or modules—and coupling means for coupling the module—or modules—to the support device.

Electrical gauges of the modular type including one or more modules with meters and vertical readout scales are already known. The modules, that can be considerably high, are normally stacked together side by side, electrically interconnected and coupled to a support device.

Basically the known support devices are of two types.

According to a first type, there is a base plate to which the modules are coupled by screws. This constructional feature is limited by some drawbacks, like the difficulty to obtain a neat mating of the modules, the need to use a plate dimensioned in such a way as to suit the maximum possible number of modules or to dispose of plates of different lengths, the considerable amount of time required for coupling or uncoupling the modules, the poor stability, the need to overturn the plate and the modules in order to accomplish the screwing and unscrewing operations.

A second type of support device includes two L-shaped sections that are arranged beside the two end modules and screws passing through the modules so as to clamp the modules together and fix them to the two aforementioned sections. It is obvious that according to this type of support device the removal of a module and/or the insertion of a new module involve rather lengthy operations.

An object of the present invention is to provide a modular gauge with vertical modules that has such a support device that considerably simplifies the coupling and uncoupling of the modules, that is steady, has small layout dimensions and can easily be adapted to accept a different number of modules forming the gauge.

This object and other objects and advantages, that will become apparent from the contents of the following description, are attained through a gauge of the type outlined at the beginning of the description wherein, according to the invention, the support device includes a base and a member fixed to the base and extending substantially in a vertical direction, the coupling means including support elements fastened to the member and hooking elements fixed to the module—or modules— for hooking the modules to the support elements.

The invention is now described in more detail with reference to the accompanying drawings, given by way of non limiting example in which.

Figure 1:
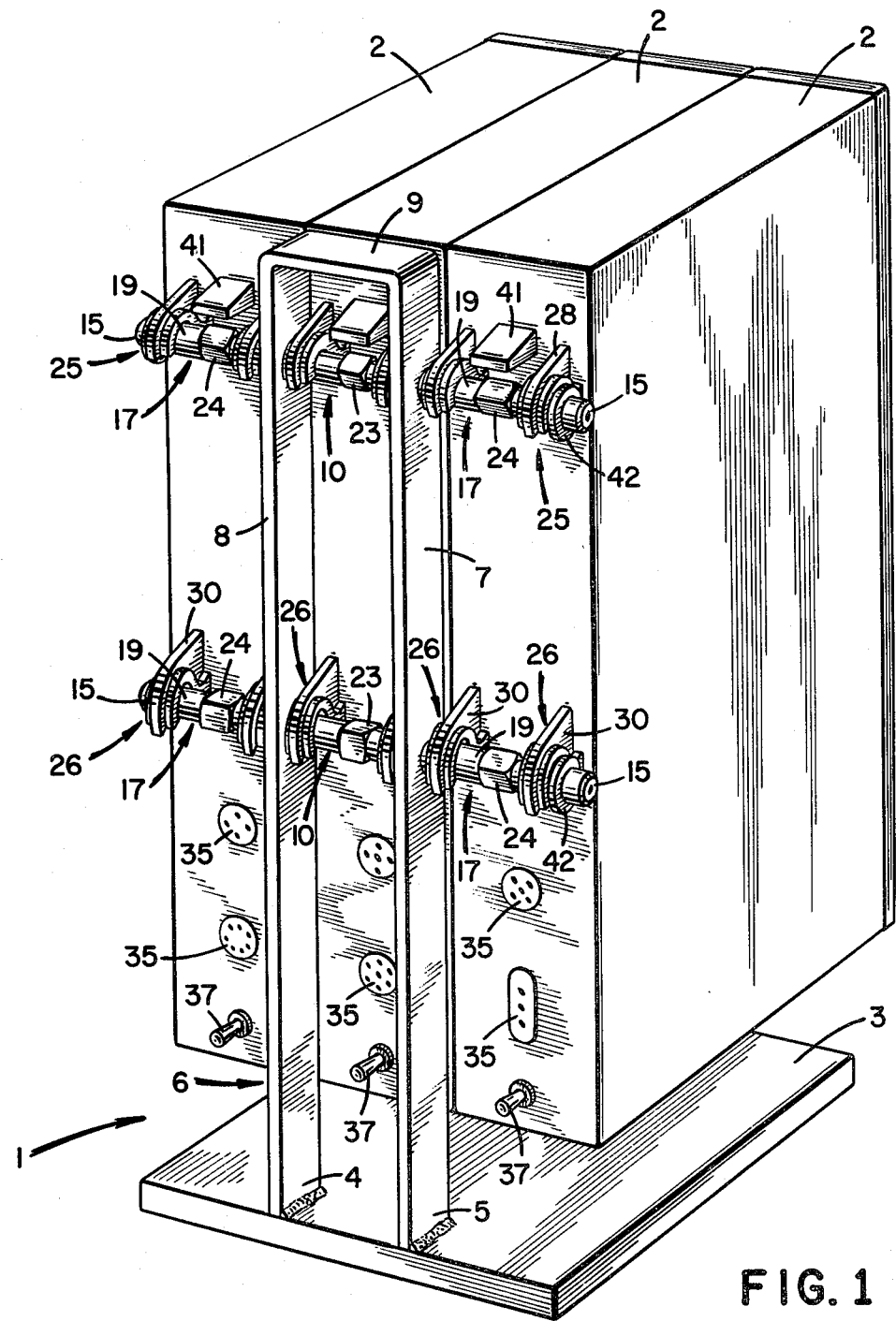
FIG. 1 is a perspective view of an electrical gauge of the modular type with three modules and a support device, according to a preferred embodiment of the invention.
Figure 2:
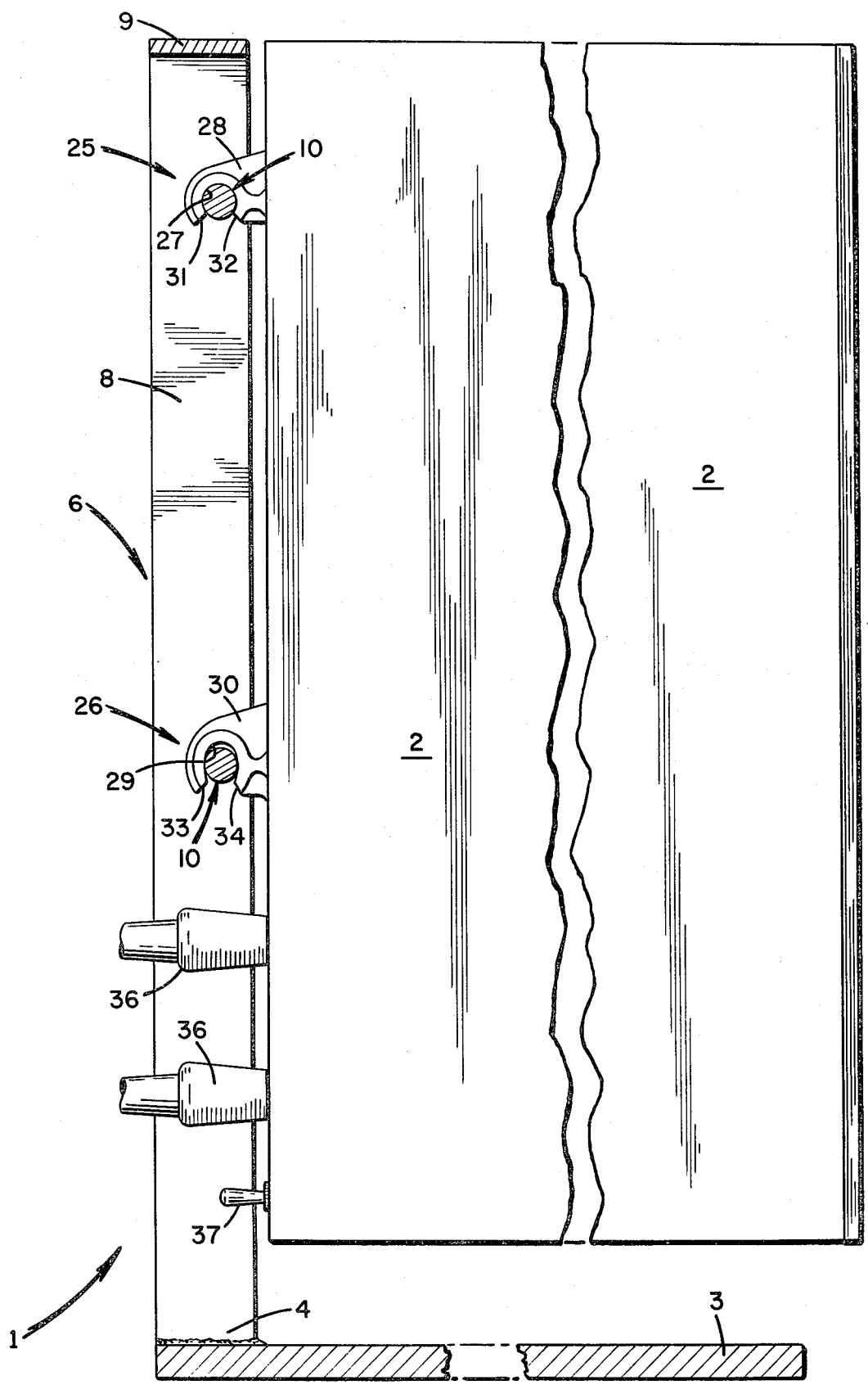
FIG. 2 is a sectional view according to a vertical plane of the gauge shown in FIG. 1.
Figure 3:
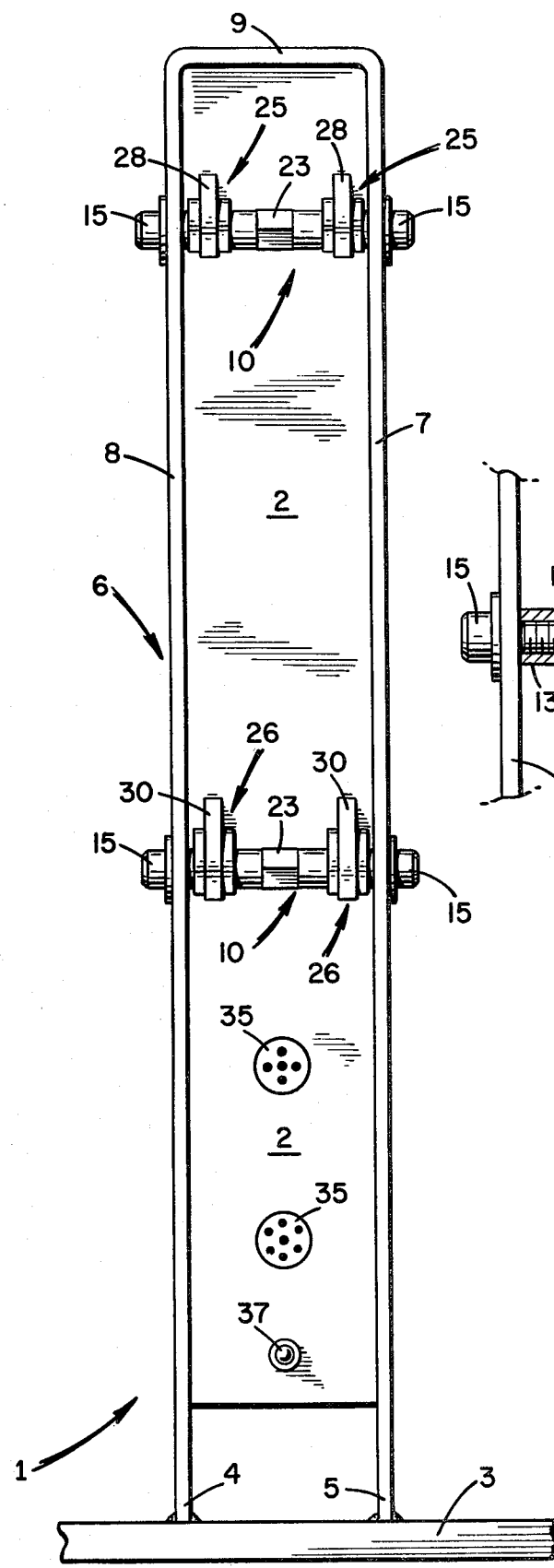
FIG. 3 is a front view of the support device of the gauge shown in FIGS. 1 and 2, adapted to support just one module.

With reference to FIGS. 1-3, reference number 1 identifies a support for one or more substantially boxed shaped units or modules 2 of an electrical gauge of the modular type. Support 1 consists of a base plate 3, with a rectangular perimeter whereupon there are welded ends 4 and 5 of a member or stanchion 6. Stanchion 6 is formed by bending a rectangular sectioned section, shown in FIG. 2, and has two vertical portions 7 and 8, connected by means of a horizontal portion 9, so that the stanchion has a substantially U-shape.

To vertical portions 7 and 8 there are fixed two coupling and support elements consisting of two identical rods or cylinders 10 whose axes are arranged along a horizontal direction, and are therefore perpendicular to portions 7 and 8. Cylinders 10, one of which is partially shown cross-sectioned in FIG. 4, have at their ends 13 and 14 threaded axial blind holes 11 and 12. Cylinders 10 are fixed to the vertical portions 7 and 8 by means of coupling screws 15—shown in FIGS. 3 and 4—and/or by means of threaded pins 16, shown in FIGS. 1 and 4, of support elements consisting of rods or cylinders 17. The connection of cylinders 10 to portions 7 and 8 is achieved by means of screws 15 when support 1 is adapted to support just one module 2 (FIG. 3). When support 1—see FIG. 1—is adapted to support three or more modules 2, the connection is achieved just by means of cylinders 17. Lastly, when support 1 is adapted to support two modules 2, the connection is achieved by using both screws 15 and cylinders 17.

Figure 4:
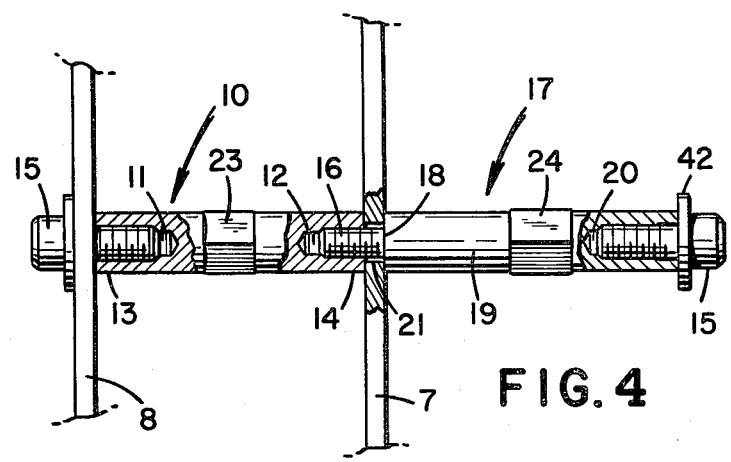
FIG. 4 shows more particularly some details of the support device adapted to support two modules.

Each cylinder 17 has, apart from the threaded pin 16, —see FIG. 4—a shoulder 18 adapted to abut against the external side of one of the vertical portions 7 and 8, and a cylindrical portion 19 whose outside diameter is identical to that of cylinders 10. One end of each cylinder 17 also has a threaded hole 20 whereto there can be screwed a threaded pin 16 of another cylinder 17, or a screw 15, depending on the number of modules 2 that need to be sustained by support 1.

Vertical portions 7 and 8 have two pairs of holes opposite each other, just one of which, 21, is shown in FIG. 4, for the passage of threaded pins 16 of cylinders 17 or of the shanks of screws 15 that fasten cylinders 10 to stanchion 6.

Cylinders 10 and 17 have intermediate portions 23 and 24, respectively, whose cross-sections have a square perimeter.

Portions 23 and 24 are obtained by bevels made on limited peripheral areas of cylinders 10 and 17 so that portions 23 and 24 provide seats for common wrenches which can be used for screwing and unscrewing threaded pins 16 of cylinders 17 with respect to holes 11 and 12 of cylinders 10.

Modules 2 shown in FIGS. 1 and 2 are made of plastic that undergoes molding processes. The rear wall of each module 2 has two pairs of hooking elements consisting of hooks 25 and 26 that are resiliently flexible in order to be coupled, by interference fit, to cylinders 10 or 17. Hooks 25 have a substantially channel shape and have an inside surface 27, shown in FIG. 2, whose cross-sectional perimeter is a circumferential arc, the length of which is slightly greater than a semicircumference. The bending radius of the inside surface 27 is slightly smaller than the radius of the outside surface of cylinders 10 and 17 so that when hooks 25 are matched to cylinders 10 and 17 they firmly clamp the latter.

Externally hooks 25 have a transversal stiffening rib 28.

Hooks 26 have a substantially channel shape and have an inside surface 29, shown in FIG. 2, whose cross-sectional perimeter has a substantially open ellipse shape. Externally hooks 26 have a transversal stiffening rib 30. Hooks 25 and 26, moreover, have chamfers 31, 32 and 33, 34, shown in FIG. 2, to facilitate the insertion of cylinders 10 and 17 within the space delimited by surfaces 27 and 29.

In order to couple a module 2 to support 1, the module is moved towards cylinders 10 and 17 with a movement that is parallel to the longitudinal direction of stanchion 6.

During the coupling operation there first occurs the insertion of cylinders 10 and 17 within the space limited by surfaces 29 of hooks 26, thereafter there occurs the insertion of cylinders 10 and 17 within the space limited by surfaces 27 of hooks 25. The insertion of cylinders 10 and 17 causes the resilient bending of the lateral walls of hooks 25 and 26 so that, when insertion has been completed, clamp cylinders 10 and 17 fasten module 2 to support 1. In order to dismantle a module 2 from support 1 it is simply necessary to push the module along the longitudinal direction of stanchion 6, from the base plate 3 towards the horizontal portion 9 of stanchion 6. This thrust can be applied by prying with a screwdriver tip inserted between cylinder 10 or 17 and a limit stop element consisting of a lug 41—shown in FIG. 1—obtained in the rear wall of module 2.

Obviously the coupling, i.e. hooking, and uncoupling operations of a module 2 are very simple and can be rapidly carried out without any need of special tools. It should be realized that the detaching of a module 2 does not imply the detaching of those beside it.

The shape of surface 29 of hook 26 is such that it does not prevent small displacements of the same hook, with respect to rod 10 or 17, along the longitudinal direction of stanchion 6 so that any possible deformations of module 2 in that direction can occur freely and without affecting the coupling stability of modules 2 to support 1. Moreover the shape of surface 29 of hook 26 allows compensating possible differences of the reciprocal distance of hooks 25 and 26 or of cylinders 10 and 17 due to machining tolerances.

Support 1 has a modular structure adapted for supporting just one module 2. In the constructional arrangement shown in FIG.1, for support 1, adapted for supporting three modules 2, it is simply necessary to replace screws 15 with cylinders 17. In order to support a larger number of modules 2, it is simply necessary to screw more cylinders 17 together. To end cylinders 17 there are screwed screws 15, with washers 42—see FIG. 4. The outside diameter of washer 42 is larger than the diameter of cylinders 17 in order to prevent undesired displacements of modules 2—that have already been secured—along the axial direction of cylinders 17.

When assembly has been accomplished just limited sliding movements of surfaces 27 and 29 of hooks 25 and 26 on the outside surface of cylinders 10 and 17, are allowed i.e. by overcoming the friction existing between the contacting surfaces in order to place the lateral walls of the adjacent modules 2 near one another.

It is obvious that the operations required for adapting support 1 to sustain a number of modules greater than one are very simple and rapid, in fact they involve just the unscrewing and screwing of screws 15 or of cylinders 17.

The shape of stanchion 6 is such as to enable access to the rear side of module 2 coupled to cylinders 10, see FIGS. 1 and 2, and it is consequently possible to arrange on this side plugs 35 for connectors 36 and switches 37—see FIG. 2. Modules 2 can be electrically interconnected in a way that has not been shown.

Figure 5:
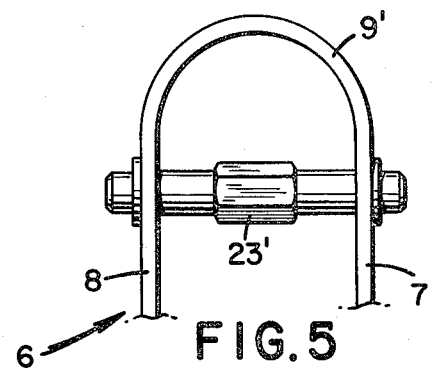
FIG. 5 shows a variant of a detail of the support device shown in FIGS. 1-4.

A variant to the constructional feature of stanchion 6 is shown in FIG. 5 and foresees a portion 9' with a semicircular profile for the connection of portions 7 and 8.

A variant to the shape of cylinders 10 foresees an intermediate portion 23'—shown in FIG. 5—that has a hexagonal cross-section; the same modification can be carried out to cylinders 17.

Figure 6:
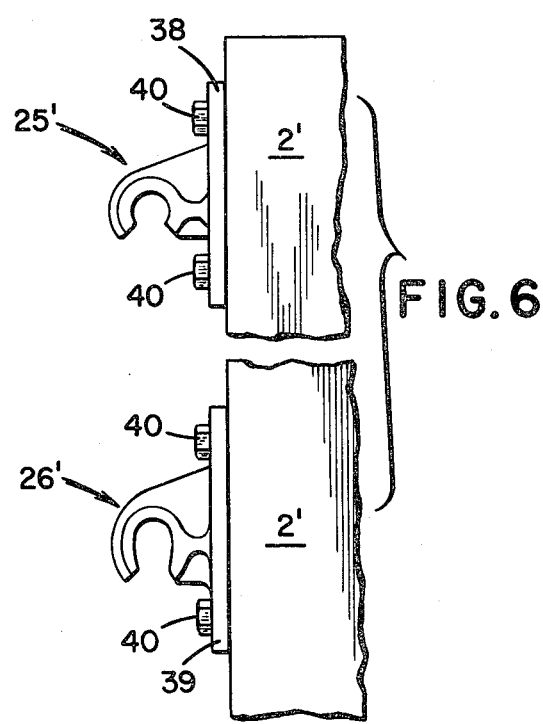
FIG. 6 shows a variant of the coupling device of a module to the support device, with respect to the embodiment shown in FIGS. 1-3.

In FIG. 6 there are shown hooks 25' and 26' with coupling flanges 38 and 39 that are coupled to a module 2' by means of screws 40. According to this feature support 1 can also be used for supporting metal modules 2', for which it is not convenient to manufacture hooks 25' and 26' in a single piece with the body of the module.

It will of course be realized that further modifications of constructional detail and design can be made, for example by changing the shape of hooks 25 and 26 in a way that they have lead-in chamfers in a position rotated by 90° in a clockwise direction with respect to chamfers 31-34 shown in FIG. 2, in order to hook modules 2 to support 1 by accomplishing a movement that is perpendicular to the longitudinal direction of stanchion 6.

What is claimed is:

1. A suspension system for an electric gauge of the modular type comprising at least one module, a support device for sustaining at least one module and coupling means for coupling the module to the support device, said support device including a base and a member fixed to the base and extending substantially in a vertical direction, said coupling means including support elements fastened to the member and hooking elements fixed to the module for hooking the modules to the support elements, said hooking elements being adapted to be coupled to the support elements and uncoupled from them by pushing the modules substantially in a vertical direction, said modules having limit stop elements adapted to facilitate the uncoupling of the modules.

2. The suspension system according to claim 1, wherein said hooking elements include resiliently flexible portions that have surfaces adapted to clamp the support elements.

3. The suspension system according to claim 2, wherein said support elements have a substantially cylindrical shape and said hooking elements include first hooking elements substantially channel shaped with the inside surface having a substantially circular and open cross-section and second hooking elements that have a substantially channel shape with the internal surface having an open substantially elliptical cross-section, the walls of the first and second hooking elements defining the resiliently flexible portions.

4. The suspension system according to claim 2, wherein said member is a section, bent to a U-shape and has a rectangular cross-section, the support elements including first support rods with ends that have axial threaded holes for fastening the first support rods in horizontal positions, to adjacent sides of the section.

5. A suspension system for an electrical gauge of the modular type comprising at least one module, a support device for sustaining at least one module and coupling means for coupling the module to the support device, said support device including a base and a member fixed to the base and extending substantially in a vertical direction, said coupling means including support elements fastened to the member and hooking elements fixed to the module for hooking the module to the support elements, said hooking elements including resiliently flexible portions that have surfaces adapted to clamp the support elements, said member being a section, bent to a U-shape and having a rectangular cross-section, and said support elements including first support rods with ends that have axial threaded holes for fastening the first support rods in horizontal positions, to adjacent sides of the section, and second support rods which can be coupled to said first support rods and together to enable the sustaining of a variable number of modules.

6. The suspension system according to claim 5, wherein said second support rods have at an end a threaded pin and at the other end a threaded hole, for coupling the second support rods to the first support rods and for the mutual connection of the second support rods.

7. The suspension system according to claim 6, wherein said first and second support rods have intermediate portions that define seats for the assembly and dismantling by means of wrenches, of the support rods.

8. The suspension system according to claim 6 or claim 7, wherein said first and second support rods include sliding surfaces adapted to allow limited displacements of the hooking elements in a horizontal direction in order to draw adjacent modules beside one another.

9. The suspension system according to claim 5 or claim 6, wherein said hooking elements are adapted to be coupled to the support elements and uncoupled from them by pushing the modules sustantially in a vertical direction, said modules having limit stop elements adapted to facilitate the uncoupling of the modules.

10. The suspension system according to claim 5 or claim 6, wherein said modules are made of plastic and the hooking elements are manufactured as a single piece with the associated module.

11. A suspension device for supporting at least one substantially box-shaped unit, comprising: a support device including a base and a member fixed to the base and extending substantially in a vertical direction; and coupling means including: one pair of support elements respectively coupled to the member in an upper and a lower position; one pair of hooking means fixed to said at least one unit; the hooking means being adapted to be coupled to said elements for coupling the unit to the elements; and coupling devices associated with said support elements for permitting the suspension of at least one additional unit, through an additional pair of support elements adapted to be removably coupled to the coupling devices and an additional pair of hooking means fixed to the additional unit and adapted to be coupled to the additional pair of support elements, whereby the additional unit may be vertically suspended, arranged at a lateral side of said at least one unit.

12. The suspension device according to claim 11, wherein said member is a section bent substantially to an inverted U-shape comprised of two side legs and a top bar connected therebetween the support elements of said one pair being horizontally arranged between the side legs of the member.

13. The suspension device according to claim 11, wherein each of the hooking means of the first pair include two hooking elements.

14. The suspension device according to claim 11, wherein said support elements of said one pair include two substantially cylindrical rods and the hooking means of said one pair include upper and lower hooking means having resiliently flexible sections with surfaces adapted to clamp the rods, the upper hooking means including at least one hooking element substantially channel shaped with the inside surface having a substantially circular and open cross-section and the lower hooking means including at least one hooking element substantially channel shaped with the internal surface having an open, substantially elliptical cross-section, the walls of the hooking elements defining said resiliently flexible sections.

15. The suspension device according to claim 12, wherein said member defines an open space between its side legs, for permitting accessibility to the back side of said at least one unit with this unit is coupled to the support elements of said one pair.

16. An apparatus of the modular type, comprising:
a plurality of modules;
a support device including a base and a member fixed to the base and extending substantially in a vertical direction;
support means for supporting said modules, the support means including: a first pair of substantially horizontal support elements for supporting a first module, said first pair including an upper element and a lower element, which are fixed to said member; and additional pairs of support elements for supporting relevant modules, each of the additional pairs including an upper and a lower support element, aligned with the elements of the first pair and removably fixed thereto; and
hooking means including a plurality of pairs of upper and lower hooking elements, each pair of hooking elements being fixed to a relevant module and adapted to hook the module to a relevant pair of support elements.

17. The apparatus according to claim 16, wherein said member of the support device includes two substantially vertical legs defining an open space therebetween, said first pair of horizontal support elements being substantially located in said open space and the additional pairs of support elements being substantially located externally to said open space.

18. The apparatus of claim 17, wherein said modules are electrical modules, the first module having a back side carrying electrical components, and wherein said open space permits access to said components.

* * * * *

UNITED STATES PATENT AND TRADEMARK OFFICE
CERTIFICATE OF CORRECTION

PATENT NO.   : 4,456,130
DATED        : June 26, 1984
INVENTOR(S)  : Mario POSSATI It is certified that error appears in the above-identified patent and that said Letters Patent is hereby corrected as shown below:

Column 4, line 38, --first elongated-- should be inserted after "including".
Column 4, line 39, --and defining means to attach longitudinally to other support elements-- should be inserted after "member".
Column 4, lines 45 and 46, "modules." should be deleted and --modules and wherein second support elements can be fixedly but removably coupled to said first support elements and together sustain a variable number of modules.-- should be inserted.
Column 4, line 63, --first-- should appear after "the".
Column 5, line 58, --fixedly but-- should appear after "be".
Column 6, line 29, "with" should be --when--.
Column 6, line 44, --fixedly but-- should appear after "and".

Signed and Sealed this

Thirteenth Day of November 1984

[SEAL]

Attest:

Attesting Officer

GERALD J. MOSSINGHOFF

Commissioner of Patents and Trademarks